(12) United States Patent
Kim et al.

(10) Patent No.: US 11,508,649 B2
(45) Date of Patent: Nov. 22, 2022

(54) SEMICONDUCTOR PACKAGE INCLUDING SUBSTRATE WITH OUTER INSULATING LAYER

(71) Applicant: Samsung Electronics Co., Ltd., Suwon-si (KR)

(72) Inventors: Eungkyu Kim, Yongin-si (KR); Jongyoun Kim, Seoul (KR); Gwangjae Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 46 days.

(21) Appl. No.: 17/222,912

(22) Filed: Apr. 5, 2021

(65) Prior Publication Data

US 2022/0084924 A1    Mar. 17, 2022

(30) Foreign Application Priority Data

Sep. 11, 2020    (KR) ........................ 10-2020-0117172

(51) Int. Cl.
| | |
|---|---|
| *H01L 23/48* | (2006.01) |
| *H01L 23/498* | (2006.01) |
| *H01L 21/48* | (2006.01) |
| *H01L 25/18* | (2006.01) |
| *H01L 25/00* | (2006.01) |
| *H01L 23/00* | (2006.01) |

(52) U.S. Cl.
CPC .... *H01L 23/49822* (2013.01); *H01L 21/4857* (2013.01); *H01L 25/18* (2013.01); *H01L 23/49833* (2013.01); *H01L 23/49866* (2013.01); *H01L 24/13* (2013.01); *H01L 24/16* (2013.01); *H01L 24/73* (2013.01); *H01L 25/50* (2013.01); *H01L 2224/13006* (2013.01); *H01L 2224/13007* (2013.01); *H01L 2224/13082* (2013.01); *H01L 2224/16227* (2013.01); *H01L 2224/16503* (2013.01); *H01L 2224/73204* (2013.01)

(58) Field of Classification Search
None
See application file for complete search history.

(56) References Cited

U.S. PATENT DOCUMENTS

| | | | |
|---|---|---|---|
| 7,368,817 | B2 | 5/2008 | Pendse |
| 8,884,431 | B2 | 11/2014 | Lin et al. |

(Continued)

FOREIGN PATENT DOCUMENTS

| | | |
|---|---|---|
| KR | 101249555 B1 | 4/2013 |
| KR | 1020210157781 A | 12/2021 |

*Primary Examiner* — Hung K Vu
(74) *Attorney, Agent, or Firm* — Muir Patent Law, PLLC

(57) ABSTRACT

A semiconductor package may include a substrate and a semiconductor chip on the substrate. The substrate may include an inner insulating layer, a redistribution layer in the inner insulating layer, an outer insulating layer on the inner insulating layer, a connection pad provided in the outer insulating layer and electrically connected to the redistribution layer, and a ground electrode in the outer insulating layer. A top surface of the connection pad may be exposed by a top surface of the outer insulating layer, and a level of the top surface of the connection pad may be lower than a level of the top surface of the outer insulating layer. A level of a bottom surface of the ground electrode may be higher than a level of a top surface of the redistribution layer, and the outer insulating layer covers a top surface of the ground electrode.

20 Claims, 18 Drawing Sheets

(56) References Cited

U.S. PATENT DOCUMENTS

| | | |
|---|---|---|
| 9,269,602 B2 | 2/2016 | Chen |
| 9,425,178 B2 | 8/2016 | Lin et al. |
| 9,627,365 B1 * | 4/2017 | Yu ................. H01L 27/2481 |
| 10,128,175 B2 | 11/2018 | Lin et al. |
| 10,332,775 B2 | 6/2019 | Rusli |
| 10,586,746 B2 | 3/2020 | Rusli |
| 2017/0317029 A1 * | 11/2017 | Hsieh ................. H01L 25/50 |
| 2019/0027456 A1 | 1/2019 | Chen et al. |
| 2019/0296002 A1 * | 9/2019 | Pei ................. H01L 21/4857 |
| 2021/0398890 A1 | 12/2021 | Kim et al. |

\* cited by examiner

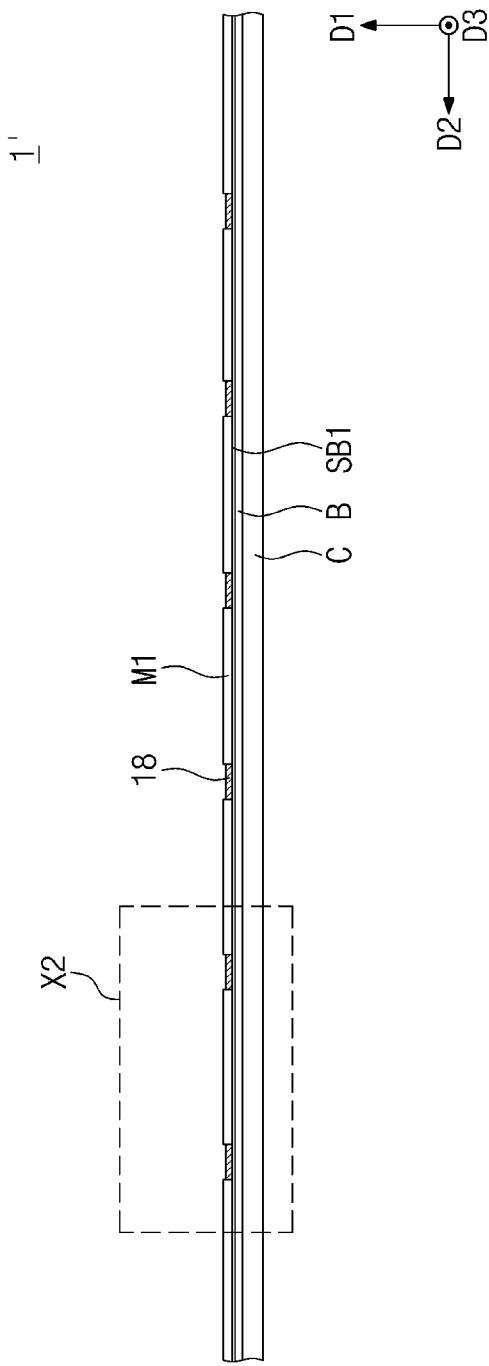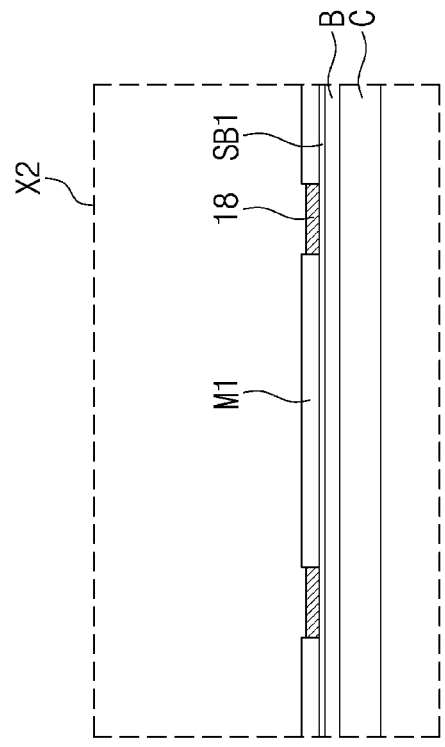

SEMICONDUCTOR PACKAGE INCLUDING SUBSTRATE WITH OUTER INSULATING LAYER

CROSS-REFERENCE TO RELATED APPLICATIONS

This U.S. non-provisional patent application claims priority under 35 U.S.C. § 119 to Korean Patent Application No. 10-2020-0117172, filed on Sep. 11, 2020, in the Korean Intellectual Property Office, the disclosure of which is hereby incorporated by reference in its entirety.

BACKGROUND OF THE INVENTION

The present disclosure relates to a semiconductor package, and in particular, to a semiconductor package, in which a substrate with an outer insulating layer is provided.

A semiconductor package is configured to allow an integrated circuit chip to be easily used as a part of an electronic product. In general, a semiconductor package includes a substrate, such as a printed circuit board (PCB) and/or a redistribution layer (RDL), and a semiconductor chip mounted thereon. A plurality of semiconductor chips are mounted in each semiconductor package. The semiconductor chips are configured to have various functions. For example, a plurality of memory chips and at least one logic chip may be mounted on one substrate. The memory chips are electrically connected to each other by through-silicon vias (TSVs) and are provided to have a stacked shape. The semiconductor package of this type may be called "2.5D package". As the number of input/output terminals of the semiconductor package has been increased, a size of the semiconductor package has also been increased. Thus, the technology to reduce the size of semiconductor package may become important.

SUMMARY

An embodiment of the inventive concept provides a semiconductor package, in which a short circuit is prevented from being formed between connection terminals, and a method of fabricating the same.

An embodiment of the inventive concept provides a semiconductor package, in which connection terminals of fine pitch are provided, and a method of fabricating the same.

An embodiment of the inventive concept provides a semiconductor package, which is configured to have an improved signal integrity (SI) property, and a method of fabricating the same.

An embodiment of the inventive concept provides a semiconductor package, in which a filling process of an under-fill layer can be easily performed, and a method of fabricating the same.

An embodiment of the inventive concept provides a semiconductor package, which is configured to prevent or suppress a warpage issue, and a method of fabricating the same.

According to an embodiment of the inventive concept, a semiconductor package may include a substrate and a semiconductor chip on the substrate. The substrate may include an inner insulating layer, a redistribution layer in the inner insulating layer, an outer insulating layer on the inner insulating layer, a connection pad provided in the outer insulating layer and electrically connected to the redistribution layer, and a ground electrode in the outer insulating layer. A top surface of the connection pad may be exposed by a top surface of the outer insulating layer, and a level of the top surface of the connection pad may be lower than a level of the top surface of the outer insulating layer. A level of a bottom surface of the ground electrode may be higher than a level of a top surface of the redistribution layer, and the outer insulating layer covers a top surface of the ground electrode.

According to an embodiment of the inventive concept, a semiconductor package may include a substrate, a logic chip on the substrate, and a high bandwidth memory (HBM) provided on the substrate and horizontally spaced apart from the logic chip. The substrate may include an inner insulating layer, a redistribution layer in the inner insulating layer, an outer insulating layer on the inner insulating layer, a connection pad provided in the outer insulating layer and electrically connected to the redistribution layer, and a connection via connecting the connection pad to the redistribution layer. A top surface of the connection pad may be exposed by a top surface of the outer insulating layer, and a level of the top surface of the connection pad may be lower than a level of the top surface of the outer insulating layer.

According to an embodiment of the inventive concept, a semiconductor package may include a redistribution substrate, a semiconductor chip on the redistribution substrate, a lower ball electrically connecting the redistribution substrate to the semiconductor chip, and an under-fill layer between the redistribution substrate and the semiconductor chip. The redistribution substrate may include an inner insulating layer, a redistribution layer in the inner insulating layer, an outer insulating layer on the inner insulating layer, a connection pad provided in the outer insulating layer and electrically connected to the redistribution layer, a connection via connecting the connection pad to the redistribution layer, and a ground electrode in the outer insulating layer. The connection pad may be disposed in an exposure hole, which is provided in the outer insulating layer, and a level of a top surface of the connection pad may be lower than a level of a top surface of the outer insulating layer. The ground electrode may be horizontally spaced apart from the connection pad, and a level of a bottom surface of the ground electrode may be the same as a level of a bottom surface of the connection pad. The outer insulating layer may cover a top surface of the ground electrode. The lower ball may be electrically connected to the connection pad through an intermediate layer formed between the lower ball and the connection pad. A portion of the under-fill layer may fill a portion of the exposure hole.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4 to 20 are sectional views illustrating a process of fabricating a semiconductor package using a method of fabricating semiconductor package, illustrated in the flow chart of FIG. 3, according to example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
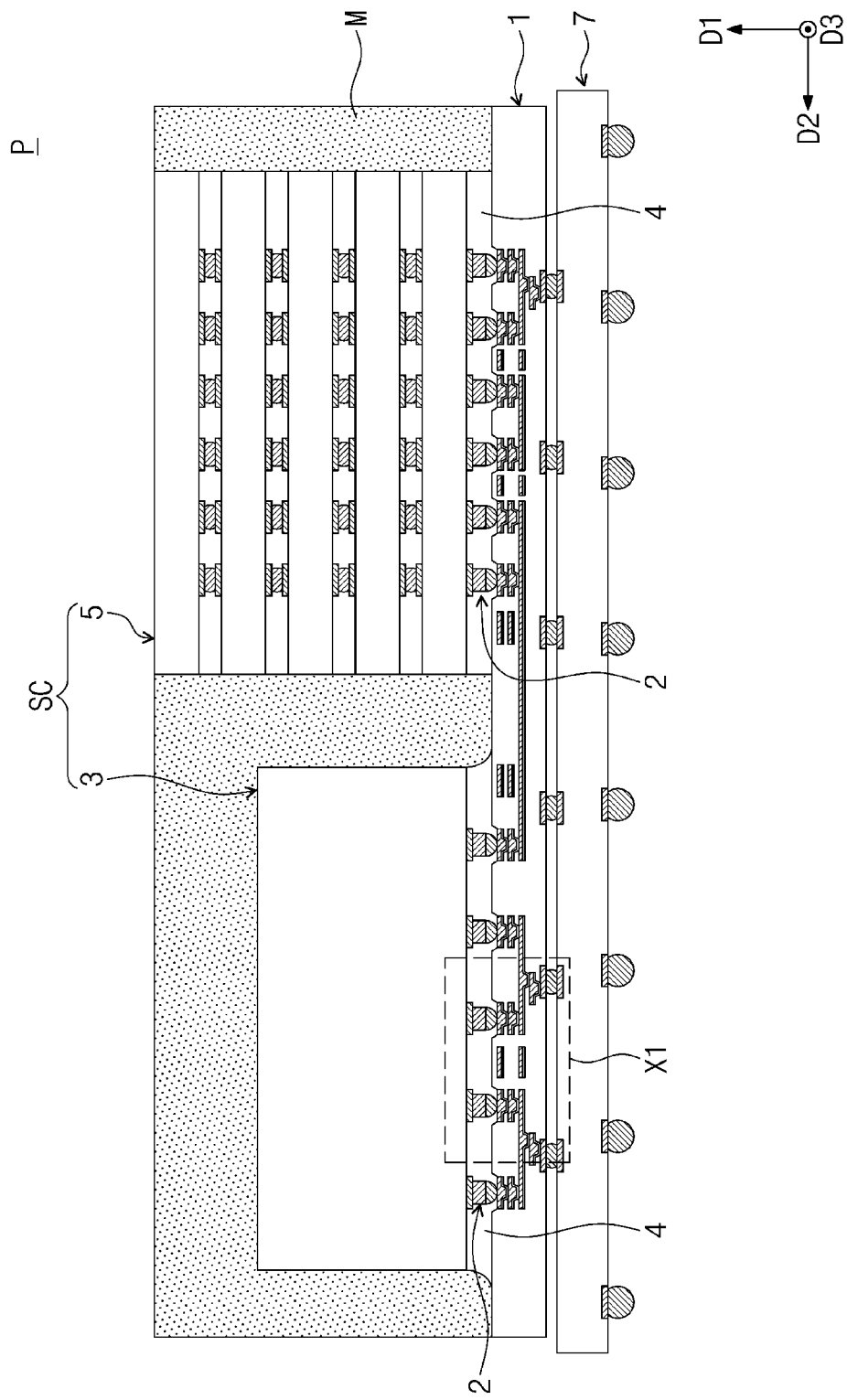
FIG. 1 is a sectional view illustrating a semiconductor package according to an embodiment of the inventive concept.

FIG. 1 is a sectional view illustrating a semiconductor package according to an embodiment of the inventive concept.

Hereinafter, the reference characters "D1" and "D2" of FIG. 1 will be referred to as first and second directions, respectively, and the reference character "D3", which is depicted to cross the first and second directions D1 and D2, will be referred to as a third direction.

Referring to FIG. 1, a semiconductor package P may be provided. The semiconductor package P may mean an electronic component, in which a semiconductor chip is bonded to a substrate, and which is configured to be mounted on an electronic product. For example, the semiconductor package P may be provided in the form of a 2.5D package, as shown in FIG. 1. However, the inventive concept is not limited to this example, and in an embodiment, the semiconductor package P may be provided in another form. However, for convenience in description, the 2.5D package will be exemplarily described in the following description.

The semiconductor package P may include a lower substrate 7, a substrate 1, a semiconductor chip SC, a connection terminal 2, an under-fill layer 4, and a mold layer M.

The lower substrate 7 may be configured to electrically connect the semiconductor chip SC and the substrate 1 to another element. For example, the lower substrate 7 may be electrically connected to the semiconductor chip SC through the substrate 1, and thus, the semiconductor chip SC may be connected to another element through the lower substrate 7. The lower substrate 7 may include a printed circuit board (PCB), but the inventive concept is not limited to this example.

The substrate 1 may be placed on the lower substrate 7. The substrate 1 may be bonded to the lower substrate 7. The substrate 1 may include a redistribution layer (RDL) substrate or a printed circuit board (PCB). The substrate 1 may be used to electrically connect the lower substrate 7 to the semiconductor chip SC. For example, the substrate 1 may be an interposer. The substrate 1 will be described in more detail below.

The semiconductor chip SC may mean an electronic component, in which an integrated circuit is provided. The semiconductor chip SC may be placed on the substrate 1. The semiconductor chip SC may be coupled to the substrate 1 through the connection terminal 2. The semiconductor chip SC may be electrically connected to the lower substrate 7 through the substrate 1. The semiconductor chip SC may include various kinds of chips. For example, the semiconductor chip SC may include a logic chip 3 and a high bandwidth memory (HBM) 5. The logic chip 3 and the HBM 5 may be horizontally spaced apart from each other. A thickness of the logic chip 3 may be smaller than a thickness of the HBM 5. The HBM 5 may include a plurality of memory chips and/or at least one logic chip. So far, the semiconductor package P has been described to be a 2.5D package, but the inventive concept is not limited to this example. For example, in the case where the semiconductor package P is a package of another type, the semiconductor chip SC may include a chip that is of a kind different from that of the above example.

In an embodiment, a plurality of the connection terminals 2 may be provided. The connection terminals 2 may be spaced apart from each other in the second direction D2 and the third direction D3. The connection terminal 2 will be described in more detail below.

The under-fill layer 4 may be positioned between the semiconductor chip SC and the substrate 1. The under-fill layer 4 may be provided to surround a side surface of the connection terminal 2. The under-fill layer 4 may protect the connection terminals 2.

The mold layer M may be provided on the substrate 1 to enclose the semiconductor chip SC. The mold layer M may be formed of or include an epoxy molding compound.

Figure 2:
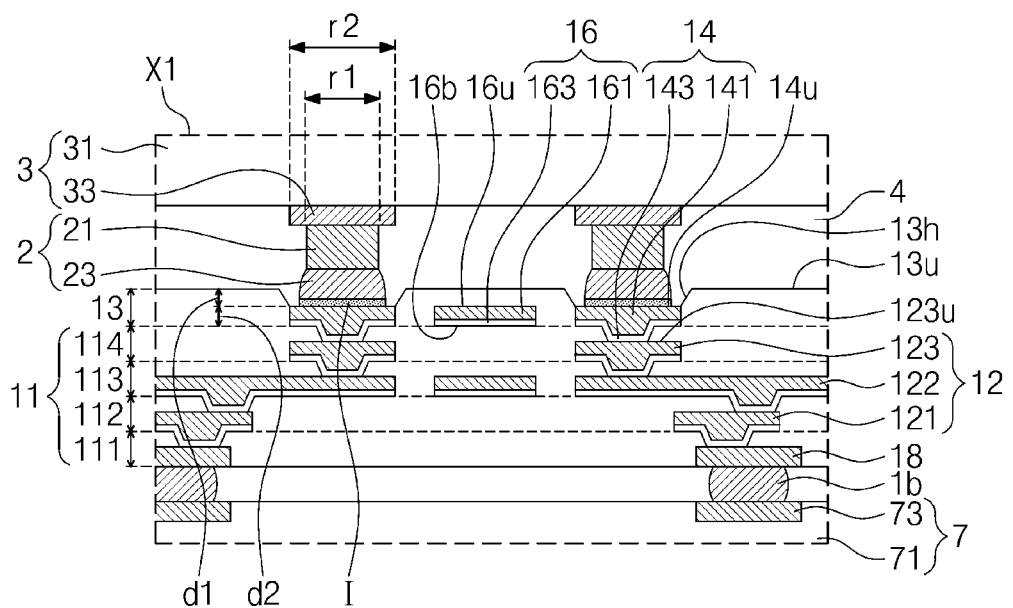
FIG. 2 is an enlarged sectional view illustrating a portion X1 of FIG. 1 according to example embodiments.

FIG. 2 is an enlarged sectional view illustrating a portion X1 of FIG. 1 according to example embodiments.

Referring to FIG. 2, the substrate 1 may include an inner insulating layer 11, an outer insulating layer 13, a redistribution layer 12, a connection pad 14, a ground electrode 16, an outer connection pad 18, and an outer connection ball 1b.

The inner insulating layer 11 may be formed of or include at least one of insulating materials. For example, the inner insulating layer 11 may include a photo-sensitive epoxy. More specifically, the inner insulating layer 11 may include a photo-imageable dielectric (PID). The inner insulating layer 11 may be disposed below the outer insulating layer 13. The redistribution layer 12 and so forth may be disposed in the inner insulating layer 11. The inner insulating layer 11 may include a plurality of layers. For example, the inner insulating layer 11 may include a first inner insulating layer 111, a second inner insulating layer 112, a third inner insulating layer 113, and a fourth inner insulating layer 114. The outer connection pad 18 may be disposed in the first inner insulating layer 111. The second inner insulating layer 112 may be disposed on the first inner insulating layer 111. A first redistribution layer 121 may be disposed in the second inner insulating layer 112 and may be electrically connected to the outer connection pad 18 through a connection via. The third inner insulating layer 113 may be disposed on the second inner insulating layer 112. A second redistribution layer 122 may be disposed in the third inner insulating layer 113 and may be electrically connected to the first redistribution layer 121 through a connection via. The fourth inner insulating layer 114 may be disposed on the third inner insulating layer 113. A third redistribution layer 123 may be disposed in the fourth inner insulating layer 114 and may be electrically connected to the second redistribution layer 122 through a connection via. So far, the inner insulating layer 11 has been described to be composed of four layers, but the inventive concept is not limited to this example. For example, the number of layers constituting the inner insulating layer 11 may not be four. In an embodiment, all of the inner insulating layers may be formed of or include the same material. In this case, there may be no observable interface between the inner insulating layers. A method of forming the inner insulating layer will be described in more detail below.

The outer insulating layer 13 may be disposed on the inner insulating layer 11. The outer insulating layer 13 may be formed of or include at least one of insulating materials. For example, the outer insulating layer 13 may include a photosensitive epoxy. More specifically, the outer insulating layer 13 may include a photo-imageable dielectric (PID). The connection pad 14 and the ground electrode 16 may be disposed in the outer insulating layer 13. The outer insulating layer 13 may provide an exposure hole 13h. The connection pad 14 may be disposed in the exposure hole 13h. The exposure hole 13h may expose the connection pad 14. More specifically, a top surface 14u of the connection pad 14 may be exposed by a top surface 13u of the outer insulating layer 13. A portion of the under-fill layer 4 may be positioned in a region of the exposure hole 13h. For example, except for a region occupied with the connection pad 14, a remaining region of the exposure hole 13h may be filled with the under-fill layer 4. A level of the top surface 13u of the outer insulating layer 13 may be higher than a level of the top surface 14u of the connection pad 14. A difference in a level between the top surface 13u of the outer insulating layer 13 and the top surface 14u of the connection pad 14 may be referred to as d1. For example, the difference d1 in level between the top surface 13u of the outer insulating layer 13 and the top surface 14u of the connection pad 14 may range from about 3 μm to about 5 μm. A thickness of the outer insulating layer 13 may range from about 8 μm to about 12 μm. This will be described in more detail below. The outer insulating layer 13 and the inner insulating layer 11 may be formed of or include the same material. For example, there may be no observable interface between the inner insulating layer 11 and the outer insulating layer 13. A method of forming the outer insulating layer will be described in more detail below.

The redistribution layer 12 may be disposed in the inner insulating layer 11. The redistribution layer 12 may include the first redistribution layer 121, the second redistribution layer 122 and the third redistribution layer 123. As described above, each of the first redistribution layer 121, the second redistribution layer 122, and the third redistribution layer 123 may be placed in a corresponding one of the second inner insulating layer 112, the third inner insulating layer 113, and the fourth inner insulating layer 114. The first redistribution layer 121, the second redistribution layer 122, and the third redistribution layer 123 may be vertically overlapped with each other. A thickness of each redistribution layer may range from about 1 μm to about 4 μm. The first redistribution layer 121, the second redistribution layer 122, and the third redistribution layer 123 may be electrically connected to each other. More specifically, the first redistribution layer 121, the second redistribution layer 122, and the third redistribution layer 123 may be connected to each other through redistribution or connection vias (not shown). The redistribution layer 12 may be configured to provide a conduction path of electrical signals. The redistribution layer 12 may be placed below the ground electrode 16. More specifically, a level of the topmost surface 123u of the redistribution layer 12 may be lower than a level of a bottom surface 16b of the ground electrode 16. In example embodiments, each of the first redistribution layer 121, the second redistribution layer 122, and the third redistribution layer 123 may include a seed-barrier layer.

The connection pad 14 may be disposed in the outer insulating layer 13. The connection pad 14 may be electrically connected to the third redistribution layer 123 through a connection via. The connection pad 14 may include a pad layer 141 and a seed-barrier layer 143. The pad layer 141 may be formed of or include copper (Cu). In an embodiment, the pad layer 141 may be formed of or include copper (Cu), nickel (Ni), and/or gold (Au). The seed-barrier layer 143 may be formed of or include copper (Cu) and/or titanium (Ti). The top surface 14u of the connection pad 14 may be exposed by the top surface 13u of the outer insulating layer 13. The top surface 14u of the connection pad 14 may be connected to the connection terminal 2. The redistribution layer 12 may be electrically connected to the connection terminal 2 through the connection pad 14. A level of the top surface 14u of the connection pad 14 may be lower than a level of the top surface 13u of the outer insulating layer 13. A thickness of the connection pad 14 may be referred to as d2. The thickness d2 of the connection pad 14 may be equal to or larger than about 5 μm.

The ground electrode 16 may be disposed in the outer insulating layer 13. The ground electrode 16 may be horizontally spaced apart from the connection pad 14. The ground electrode 16 may include a ground layer 161 and a seed-barrier layer 163. The ground layer 161 may be formed of or include substantially the same material as the pad layer 141. For example, the ground layer 161 may be formed of or include copper (Cu). In an embodiment, the ground layer 161 may be formed of or include copper (Cu), nickel (Ni), and/or gold (Au). The seed-barrier layer 163 may be formed of or include copper (Cu) and/or titanium (Ti). A level of the bottom surface 16b of the ground electrode 16 may be higher than the level of the topmost surface 123u of the redistribution layer 12. The level of the bottom surface 16b of the ground electrode 16 may be equal to or similar to a level of a bottom surface of the connection pad 14. A level of a top surface 16u of the ground electrode 16 may be equal to or similar to the level of the top surface 14u of the connection pad 14. For example, a thickness of the ground electrode 16 may be equal to or similar to the thickness of the connection pad 14. For example, the thickness of the ground electrode 16 may be equal to or larger than about 4 μm. The ground electrode 16 may be covered with the outer insulating layer 13. For example, the top surface 16u of the ground electrode 16 may be covered with the outer insulating layer 13. The outer insulating layer 13 may be provided such that the ground electrode 16 is not exposed to the outside. The ground electrode 16 may be electrically connected to a ground ball (not shown). This will be described in more detail below.

The outer connection pad 18 may be disposed in the first inner insulating layer 111. A bottom surface of the outer connection pad 18 may be exposed by a bottom surface of the inner insulating layer 11.

The outer connection ball 1b may be coupled to the bottom surface of the outer connection pad 18. The outer connection ball 1b may be electrically connected to the redistribution layer 12. The outer connection ball 1b may be coupled to a lower substrate pad 73. The redistribution layer 12 may be electrically connected to the lower substrate 7 through the outer connection ball 1b. In an embodiment, a plurality of the outer connection balls 1b may be provided. The outer connection ball 1b may include a ground ball (not shown). The ground ball may be electrically connected to the ground electrode 16. The ground ball may be used to ground the ground electrode 16 to the outside.

The logic chip 3 may include a chip body 31 and a lower pad 33. The chip body 31 may include various integrated circuits provided therein. The lower pad 33 may be disposed below the chip body 31. The connection terminal 2 may be coupled to the lower pad 33.

The connection terminal 2 may include a pillar portion 21 and a lower ball 23. The pillar portion 21 may be coupled to the lower pad 33. The pillar portion 21 may be extended downward from the lower pad 33. The pillar portion 21 may be electrically connected to the integrated circuit in the chip body 31 through the lower pad 33. In an embodiment, the pillar portion 21 may be formed of or include copper (Cu). For example, the pillar portion 21 may mean a copper pillar. A diameter of the pillar portion 21 may be referred to as r1. The diameter r1 of the pillar portion 21 may be larger than a width r2 of the lower pad 33. The diameter r1 of the pillar portion 21 may range from about 30 μm to about 60 μm. The lower ball 23 may be bonded to a bottom of the pillar portion 21. The lower ball 23 may include a solder. For example, the lower ball 23 may be formed of or include Sn—Ag or the like. The lower ball 23 may be coupled to the connection pad 14. If the lower ball 23 is coupled to the connection pad 14, the lower ball 23 may be deformed. More specifically, in the case where the lower ball 23 is coupled to the connection pad 14 through a reflow process or a thermo-compression bonding process, the lower ball 23 may be deformed. For example, the lower ball 23 may be horizontally widened along a top surface of the pad layer 141. An intermediate layer I may be formed between the lower ball 23 and the pad layer 141. The intermediate layer I may be an inter-metallic compound (IMC). The intermediate layer I may be formed by a bonding between the lower ball 23 and the connection pad 14. The intermediate layer I may be an inter-metallic compound (IMC) between the lower ball 23 and the connection pad 14. More specifically, the intermediate layer I may be an inter-metallic compound (IMC) between the lower ball 23 and the pad layer 141. The lower ball 23 may be coupled to the connection pad 14 through the intermediate layer I. The lower ball 23 may be electrically connected to the connection pad 14. For example, the lower ball 23 may be electrically connected to the pad layer 141 through the intermediate layer I.

The lower substrate 7 may include a lower substrate body 71 and the lower substrate pad 73. The lower substrate pad 73 may be coupled to the outer connection ball 1b. The lower substrate pad 73 may be electrically connected to the substrate 1 through the outer connection ball 1b.

Figure 3:
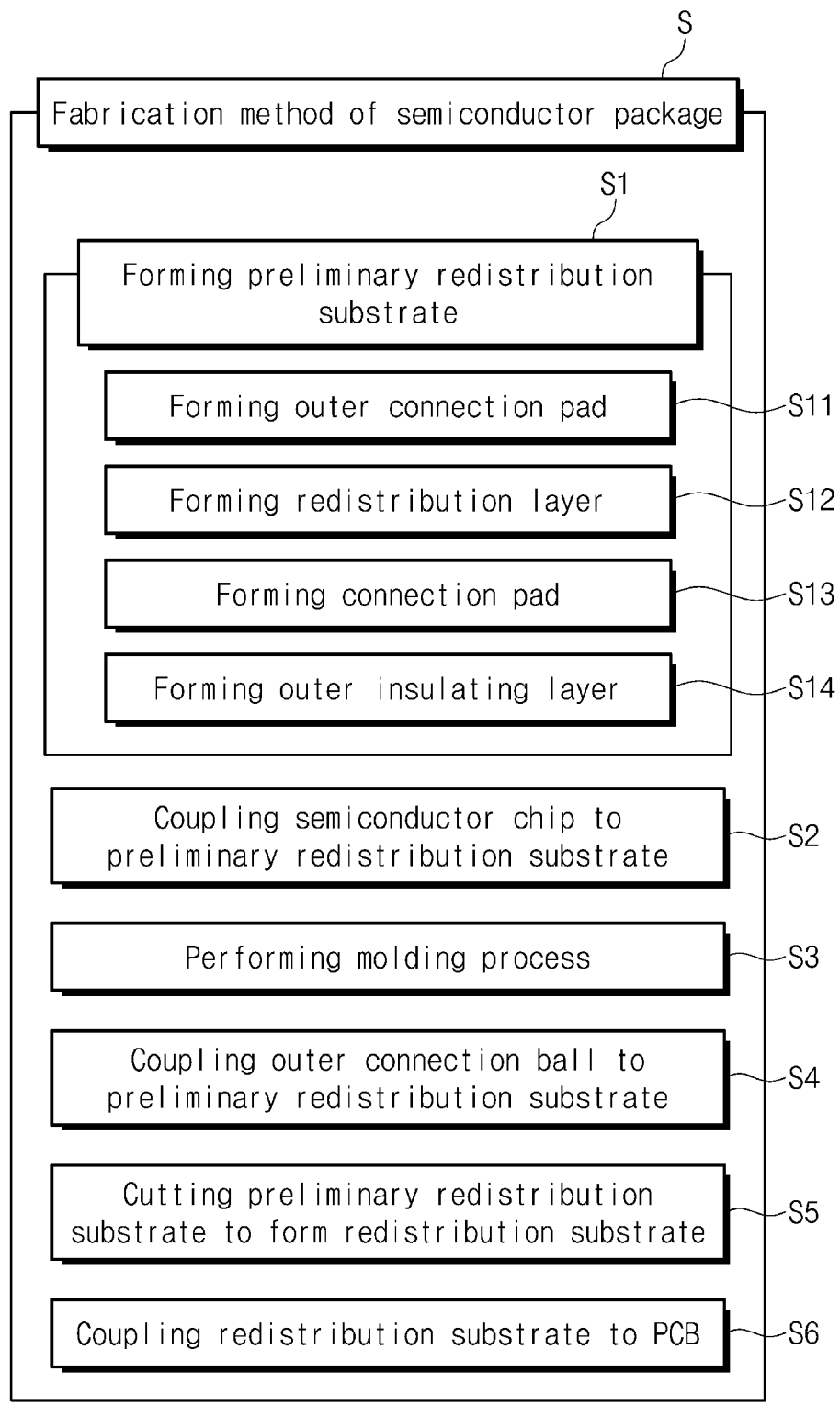
FIG. 3 is a flow chart illustrating a method of fabricating a semiconductor package, according to an embodiment of the inventive concept.

FIG. 3 is a flow chart illustrating a method of fabricating a semiconductor package, according to an embodiment of the inventive concept.

Referring to FIG. 3, a method of fabricating a semiconductor package (S) may be provided. The semiconductor package P of FIG. 1 may be fabricated by the fabrication method S of FIG. 3. The fabrication method (S) may include forming a preliminary redistribution substrate (step S1), coupling a semiconductor chip to the preliminary redistribution substrate (step S2), performing a molding process (step S3), coupling an outer connection ball to the preliminary redistribution substrate (step S4), cutting the preliminary redistribution substrate to form a redistribution substrate (step S5), and coupling the redistribution substrate to a PCB (step S6).

The forming of the preliminary redistribution substrate (step S1) may include forming an outer connection pad (step S11), forming a redistribution layer (step S12), forming a connection pad (step S13), and forming an outer insulating layer (step S14).

Hereinafter, each step of the fabrication method S of FIG. 3 will be described in more detail with reference to FIGS. 4 to 20.

FIGS. 4 to 20 are sectional views illustrating a process of fabricating a semiconductor package using a method of fabricating semiconductor package, illustrated in the flow chart of FIG. 3, according to example embodiments.

Referring to FIGS. 4 and 5 in conjunction with FIG. 3, the forming of the outer connection pad (step S11) may be performed on a carrier substrate C. A preliminary redistribution substrate 1' may be processed in a wafer state. For example, the preliminary redistribution substrate 1' may be processed and formed in the wafer state, not in a shape of a single chip. An adhesive layer B may be provided on the carrier substrate C. A first preliminary seed-barrier layer SB1 may be formed on the carrier substrate C. The first preliminary seed-barrier layer SB1 may be coupled to the carrier substrate C by the adhesive layer B interposed therebetween. A first photomask pattern M1 may be formed on the first preliminary seed-barrier layer SB1. The first photomask pattern M1 may be formed to have an opening, in which the outer connection pad 18 will be formed. The first photomask pattern M1 may be formed by forming, exposing, and developing a photoresist layer. The outer connection pad 18 may be formed in the opening of the first photomask pattern M1. For example, the outer connection pad 18 may be formed by an electroplating process, in which the first preliminary seed-barrier layer SB1 is used as an electrode. After the formation of the outer connection pad 18, the first photomask pattern M1 may be removed. After the removal of the first photomask pattern M1, the first inner insulating layer 111 (e.g., see FIG. 6) may be formed. The first inner insulating layer 111 may be formed by a coating process (e.g., a spin coating process or a slit coating process). The first inner insulating layer 111 may be patterned by an exposure and developing process.

Figure 6:
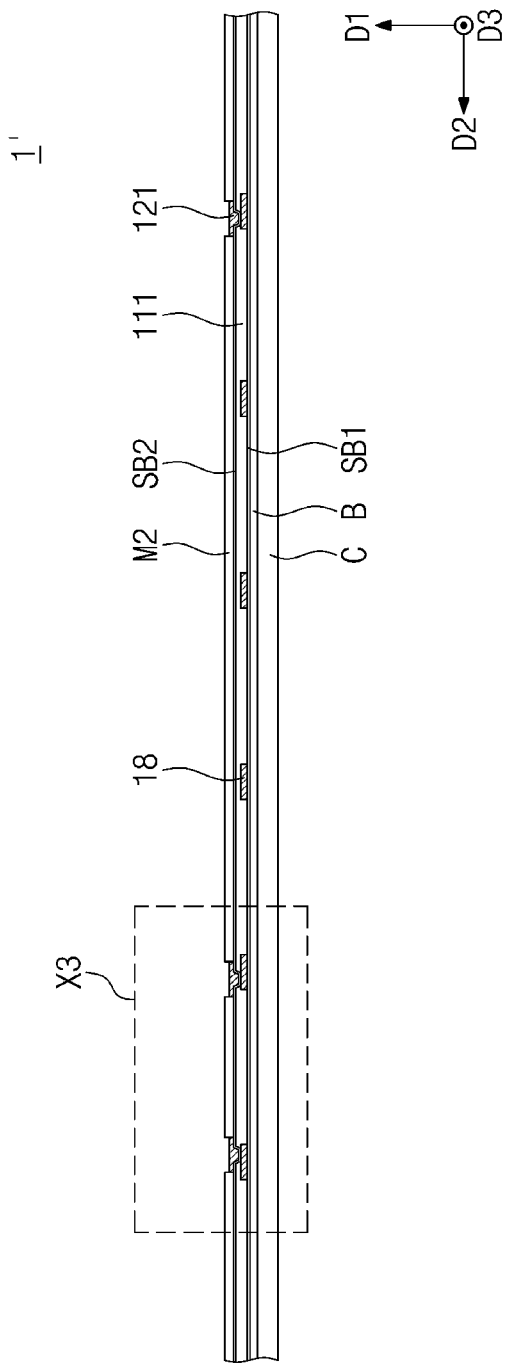
Figure 7:
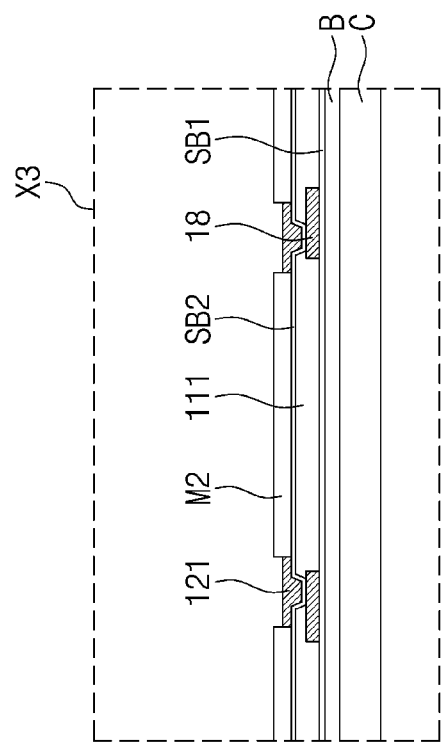

Referring to FIGS. 6 and 7 in conjunction with FIG. 3, the forming of the redistribution layer (step S12) may include forming a second preliminary seed-barrier layer SB2 and a second photomask pattern M2 on the outer connection pad 18 and the patterned first inner insulating layer 111. The second photomask pattern M2 may be formed to have an opening, and the first redistribution layer 121 may be formed in the opening of the second photomask pattern M2. The first redistribution layer 121 may be formed by an electroplating process, in which the second preliminary seed-barrier layer SB2 is used as an electrode.

Figure 8:
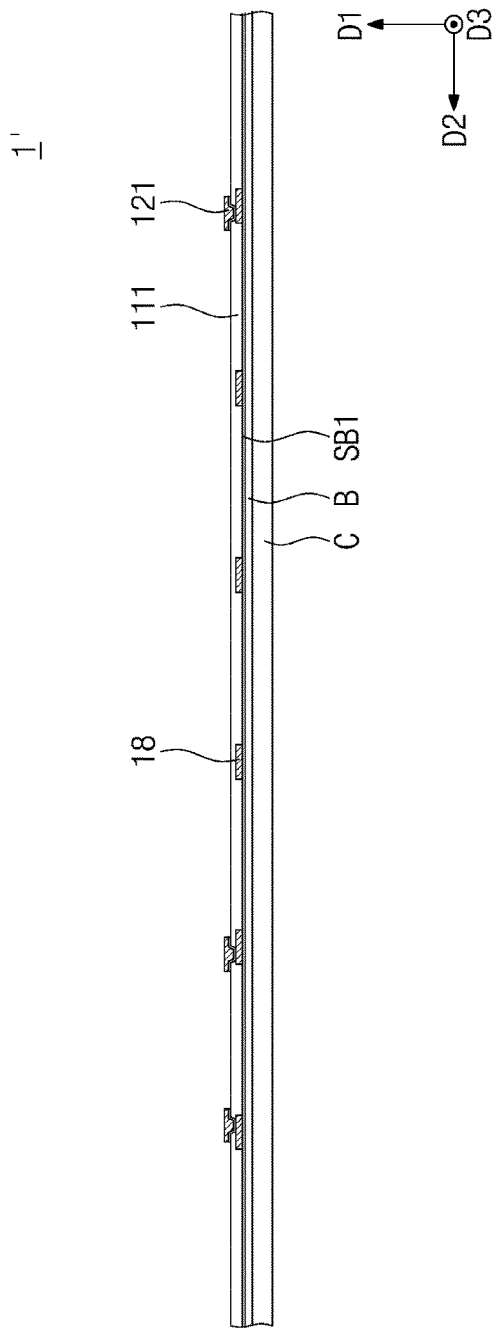

Referring to FIG. 8, the second photomask pattern M2 may be removed. In addition, the second preliminary seed-barrier layer SB2 may be removed from a region except to a lower region of the first redistribution layer 121. The second preliminary seed-barrier layer SB2 may be removed by various methods. For example, the second preliminary seed-barrier layer SB2 may be removed by an etching process. However, the inventive concept is not limited to this example, and in an embodiment, the second preliminary seed-barrier layer SB2 may be removed by various other methods.

Figure 9:
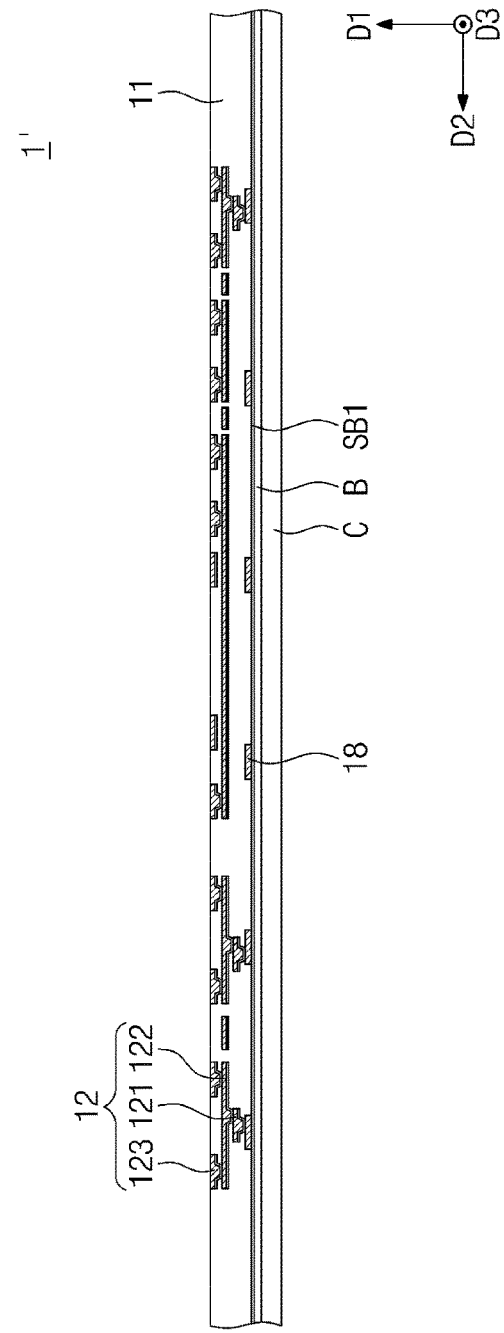

Referring to FIG. 9, the second redistribution layer 122 and the third redistribution layer 123 may be formed on the first inner insulating layer 111 and the first redistribution layer 121. The second redistribution layer 122 and the third redistribution layer 123 may be formed by the same method as that for the first redistribution layer 121.

Figure 10:
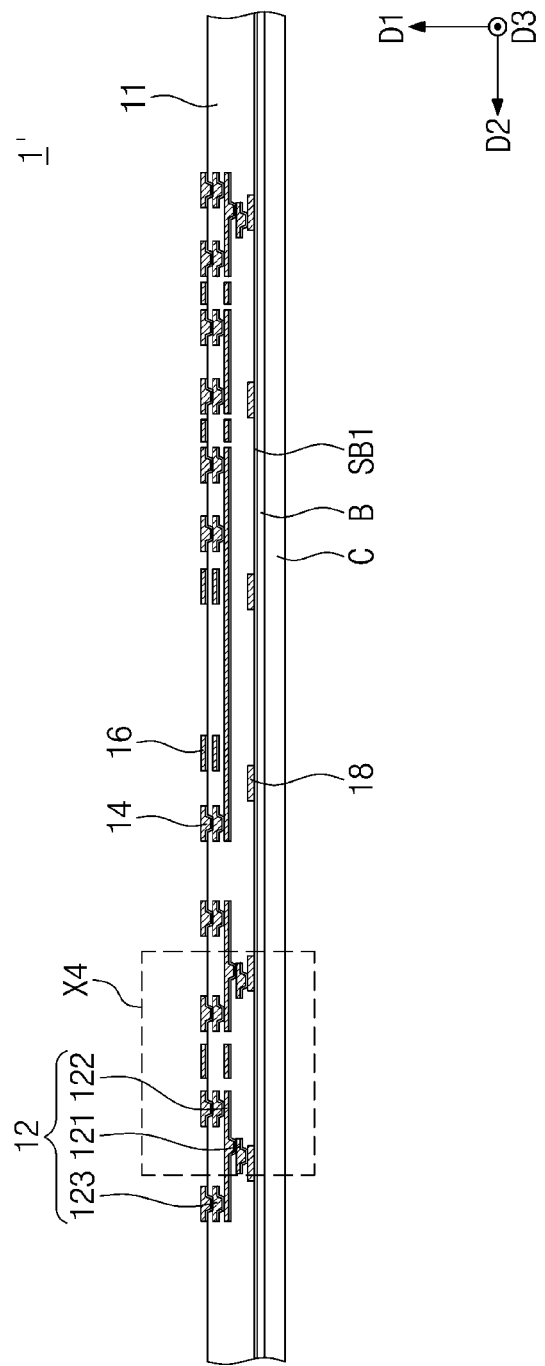
Figure 11:
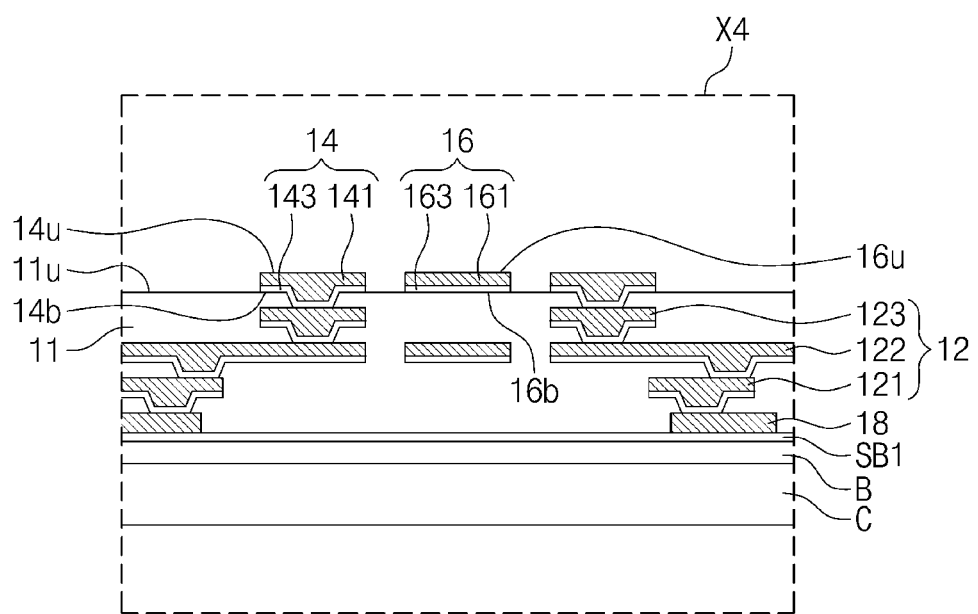

Referring to FIGS. 10 and 11 in conjunction with FIG. 3, the forming of the connection pad (step S13) may include forming the connection pad 14 and the ground electrode 16 on the redistribution layer 12 and the inner insulating layer 11. The connection pad 14 and the ground electrode 16 may be formed by a method similar to that for the redistribution layer 12. For example, the connection pad 14 and the ground electrode 16 may be formed by an electroplating process, in which the seed-barrier layer is used as an electrode. The connection pad 14 and the ground electrode 16 may be formed simultaneously by performing the electroplating process once. Thus, a level of a bottom surface 14b of the connection pad 14 may be equal to or similar to a level of the bottom surface 16b of the ground electrode 16. A level of the top surface 14u of the connection pad 14 may be equal to or similar to a level of the top surface 16u of the ground electrode 16. The connection pad 14 may be electrically connected to the redistribution layer 12. More specifically, the connection pad 14 may be connected to a top surface of the third redistribution layer 123.

In a semiconductor package and its fabricating method according to an embodiment of the inventive concept, the connection pad and the ground electrode may be simultaneously formed by a single process. Thus, the connection pad and the ground electrode may be formed of or include the same material. In addition, since the connection pad and the ground electrode are formed at the same time, it may be possible to reduce the number of process steps and thereby to simplify an overall fabrication process. Thus, it may be possible to reduce process time and fabrication cost.

Figure 12:
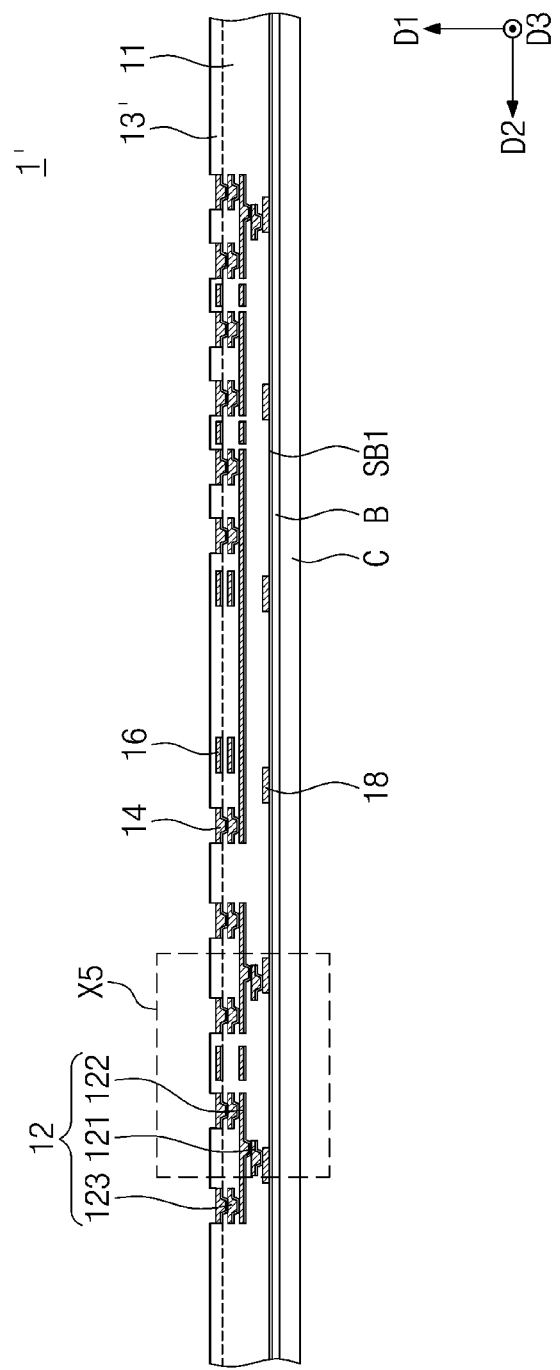
Figure 13:
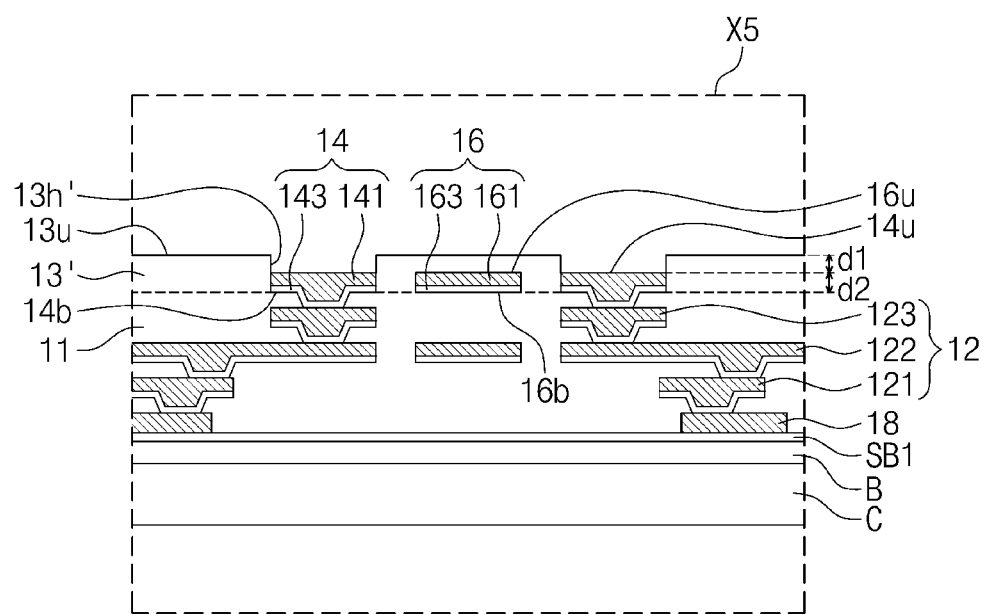

Referring to FIGS. 12 and 13 in conjunction with FIG. 3, the forming of the outer insulating layer (step S14) may include forming an outer insulating layer 13' to cover the ground electrode 16. The outer insulating layer 13' may be patterned. More specifically, the outer insulating layer 13' may be patterned to expose the connection pad 14. For example, the outer insulating layer 13' may be patterned to define an exposure hole 13h'. The connection pad 14 may be disposed in the exposure hole 13h'. Even when the outer insulating layer 13' is patterned, the ground electrode 16 may not be exposed. For example, the ground electrode 16 may be covered with the outer insulating layer 13'.

Figure 14:
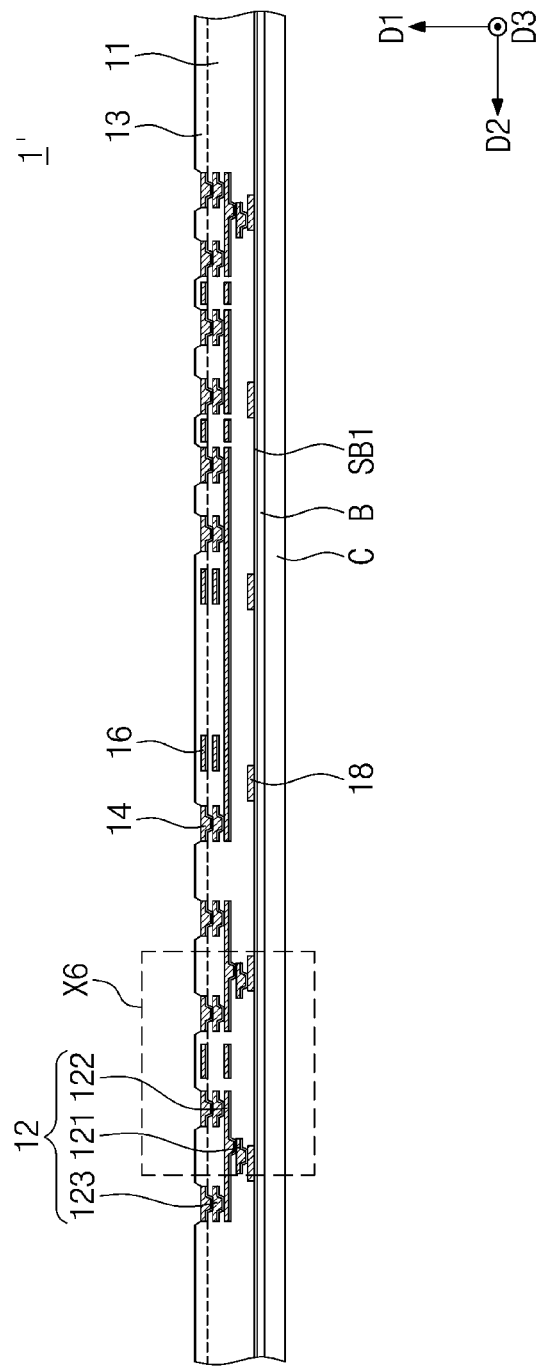
Figure 15:
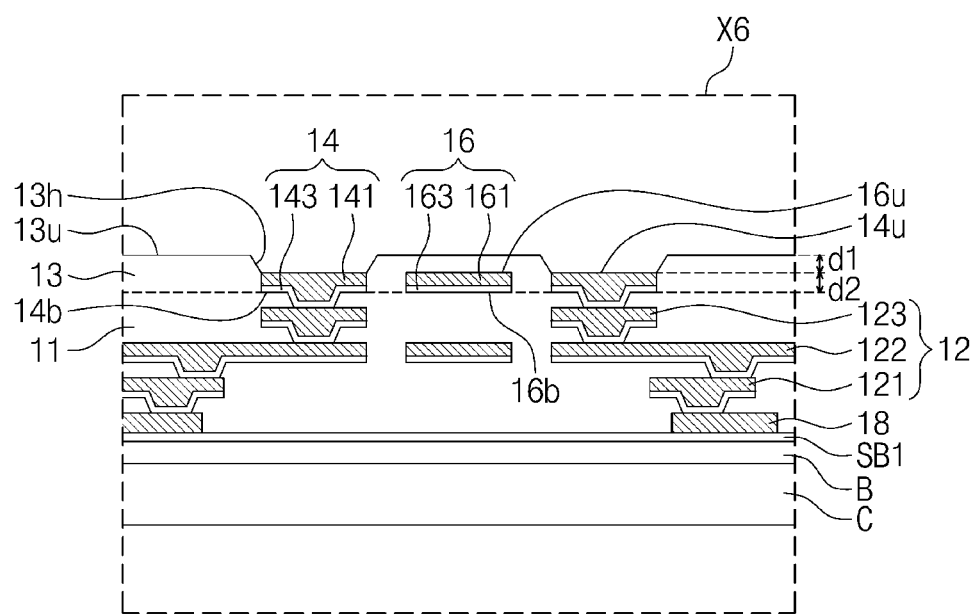

Referring to FIGS. 14 and 15, the outer insulating layer 13 may be formed after the outer insulating layer 13' is cured. After the curing of the outer insulating layer 13', a side surface of the outer insulating layer 13 defining the exposure hole 13h may be inclined at an angle to a top surface thereof.

Figure 16:
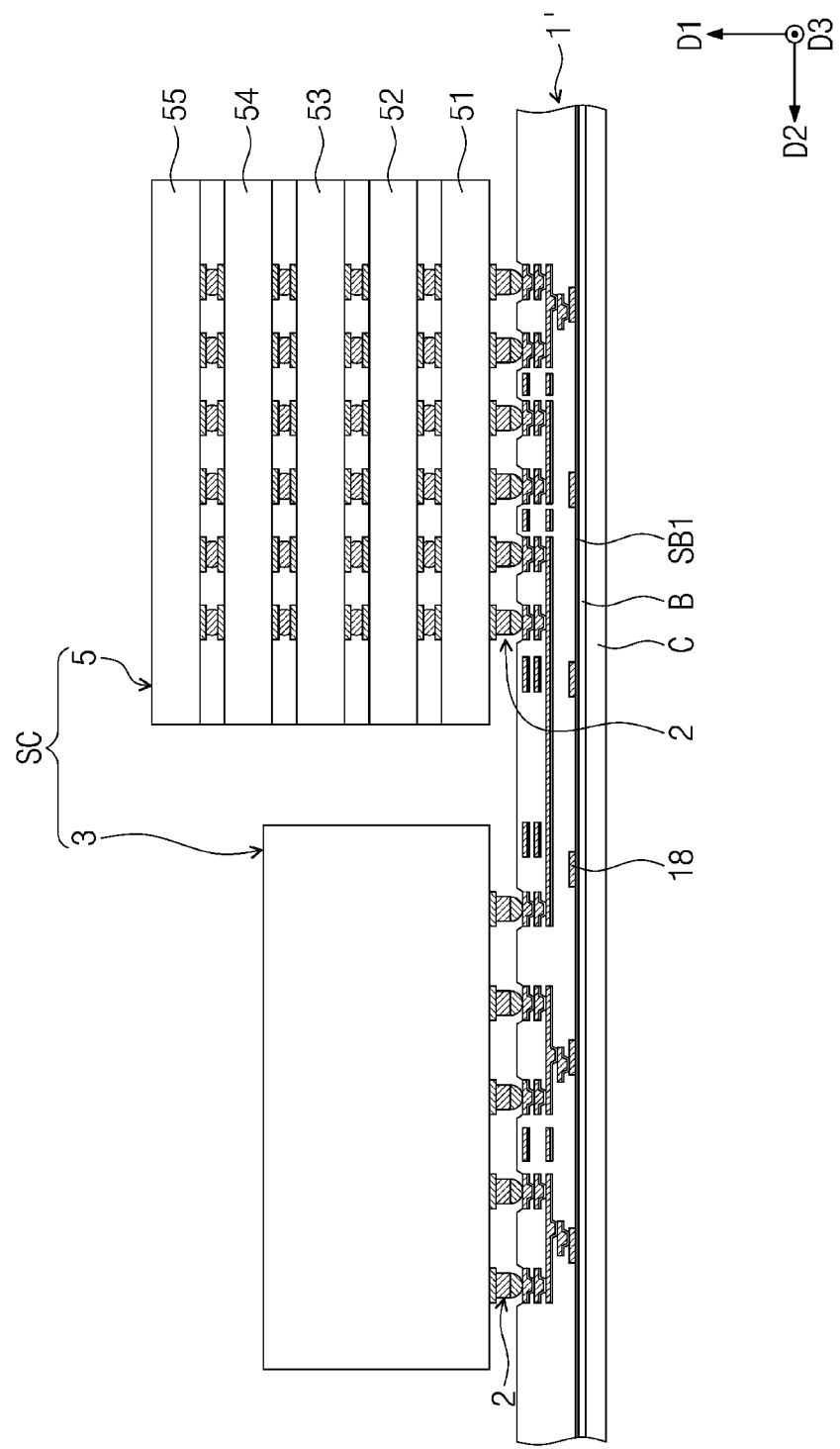

Referring to FIGS. 3 and 16, the coupling of the semiconductor chip to the preliminary redistribution substrate (step S2) may include coupling the semiconductor chip SC to the preliminary redistribution substrate 1' in a wafer state. In an embodiment, when the semiconductor package is provided in the form of the 2.5D package, the semiconductor chip SC may include the logic chip 3 and the HBM 5. The logic chip 3 may be connected to the preliminary redistribution substrate 1' through the connection terminals 2. The HBM 5 may include a plurality of semiconductor chips. For example, the HBM 5 may be a structure, in which a lower logic chip 51, a first memory chip 52, a second memory chip 53, a third memory chip 54, and a fourth memory chip 55 are vertically stacked. The lower logic chip 51 may be connected to the preliminary redistribution substrate 1' through the connection terminals 2. The plurality of vertically-stacked semiconductor chips may be electrically connected to each other via through-silicon vias (TSVs). The logic chip 3 and the HBM 5 may be horizontally spaced apart from each other. The order of disposing or coupling the logic chip 3 and the HBM 5 may be variously changed. In an embodiment, the semiconductor chip SC may be coupled to the preliminary redistribution substrate 1' by a thermo-compression bonding process. However, the inventive concept is not limited to this example, and the semiconductor chip SC may be coupled to the preliminary redistribution substrate 1' by a reflow process. In an embodiment, before the bonding of the semiconductor chip SC, the under-fill layer 4 (e.g., see FIG. 17) may be further provided between the semiconductor chip SC and the preliminary redistribution substrate 1'. The under-fill layer 4 may be filled using a capillary phenomenon between the semiconductor chip SC and the preliminary redistribution substrate 1'. As a distance between the semiconductor chip SC and the preliminary redistribution substrate 1' is decreased, the filling process of the under-fill layer 4 may be more effectively performed.

Figure 17:
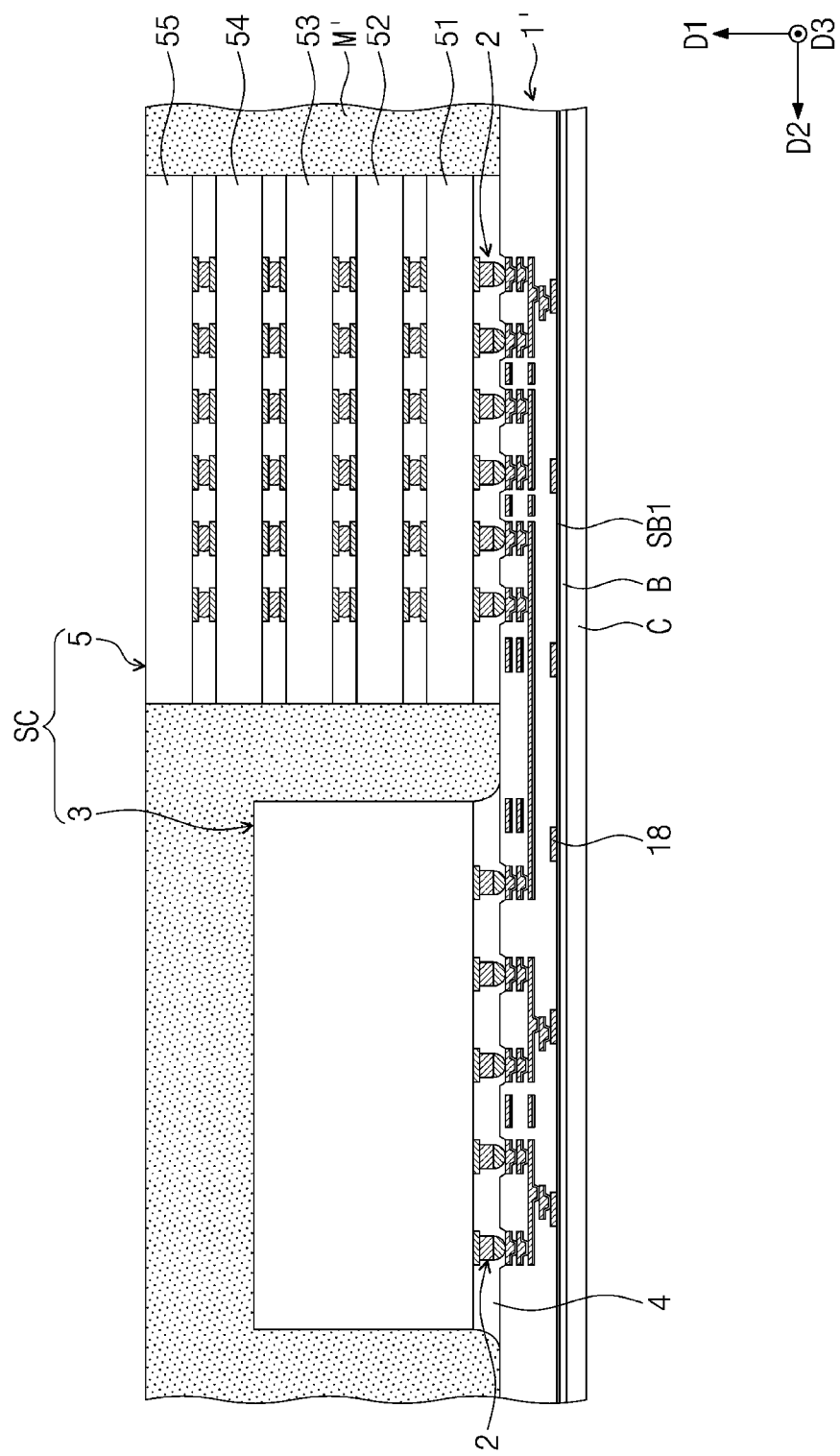

Referring to FIGS. 3 and 17, the molding process (step S3) may include forming a mold layer M' on the preliminary redistribution substrate 1' in a wafer state. The mold layer M' may enclose the side surface of the semiconductor chip SC. More specifically, the mold layer M' may enclose the side surfaces of the logic chip 3 and the HBM 5. In the case where the top surface of the HBM 5 is covered with the mold layer M', an upper portion of the mold layer M' may be ground to expose the top surface of the HBM 5.

Figure 18:
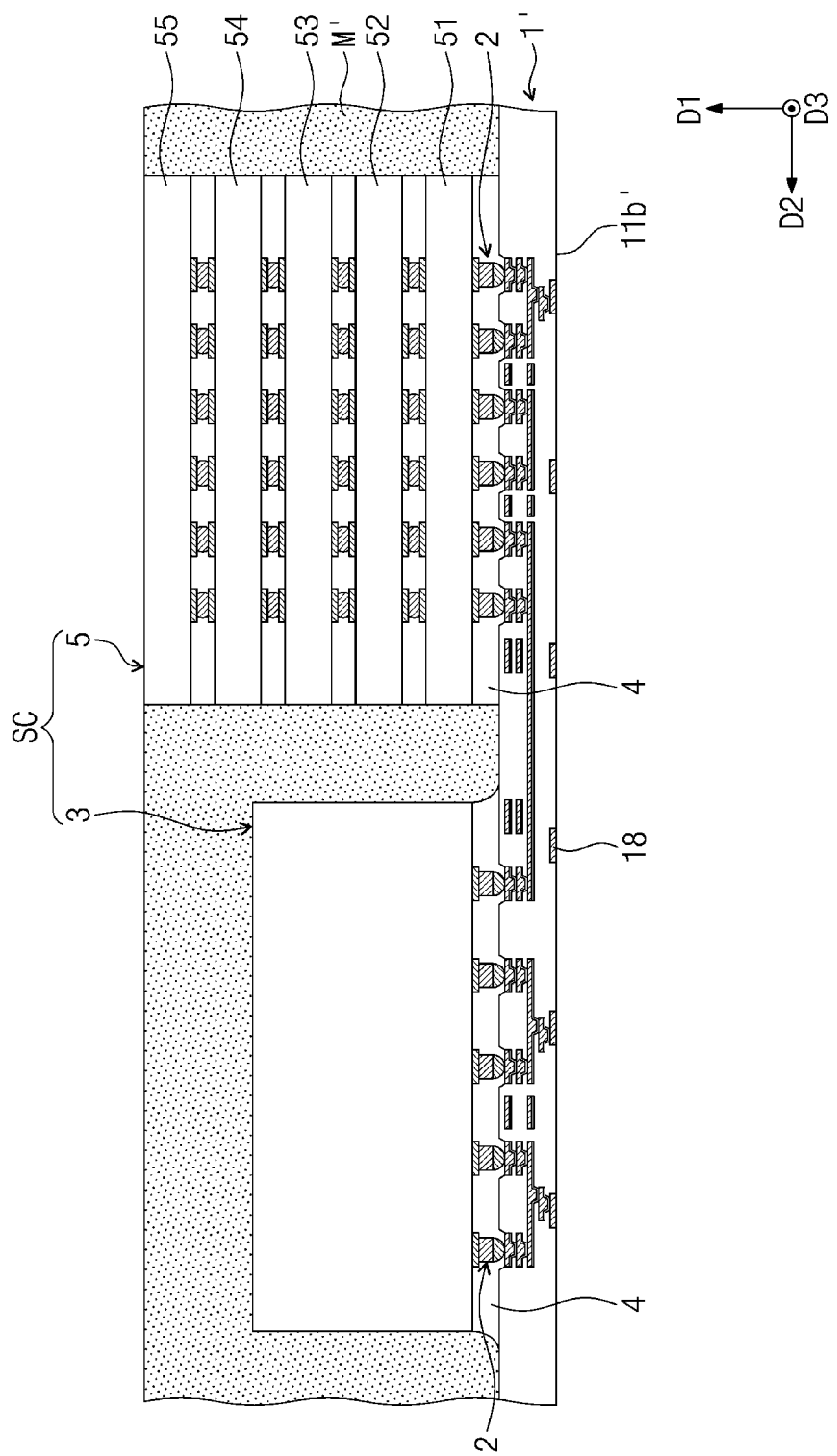

Referring to FIG. 18, the carrier substrate C (e.g., see FIG. 17) may be removed. More specifically, the carrier substrate C, the adhesive layer B, and the first preliminary seed-barrier layer SB1 may be removed. The removal of the first preliminary seed-barrier layer SB1 may be performed through an etching process. The outer connection pad 18 may be exposed, as a result of the removal of the first preliminary seed-barrier layer SB1. More specifically, the bottom surface of the outer connection pad 18 may be exposed through a bottom surface 11b' of the preliminary redistribution substrate 1'.

Figure 19:
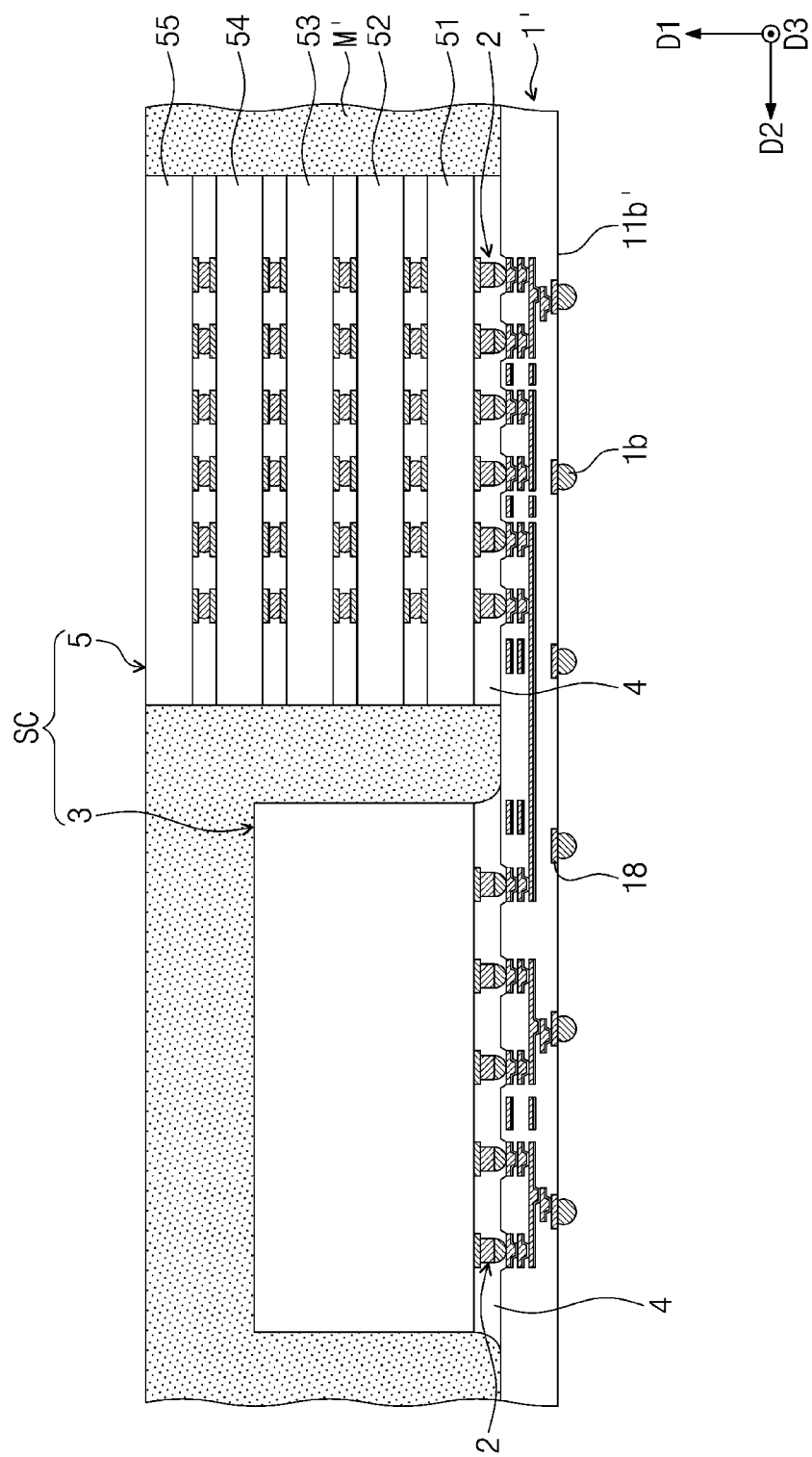

Referring to FIGS. 3 and 19, the coupling of the outer connection ball to the preliminary redistribution substrate (step S4) may include coupling the outer connection ball 1b to the outer connection pad 18. More specifically, the outer connection ball 1b may be coupled to the bottom surface of the outer connection pad 18 exposed by the removal of the first preliminary seed-barrier layer SB1 in FIG. 18. The outer connection ball 1b may include a solder ball. The outer connection pad 18 may be electrically connected to the outside through the outer connection ball 1b.

Figure 20:
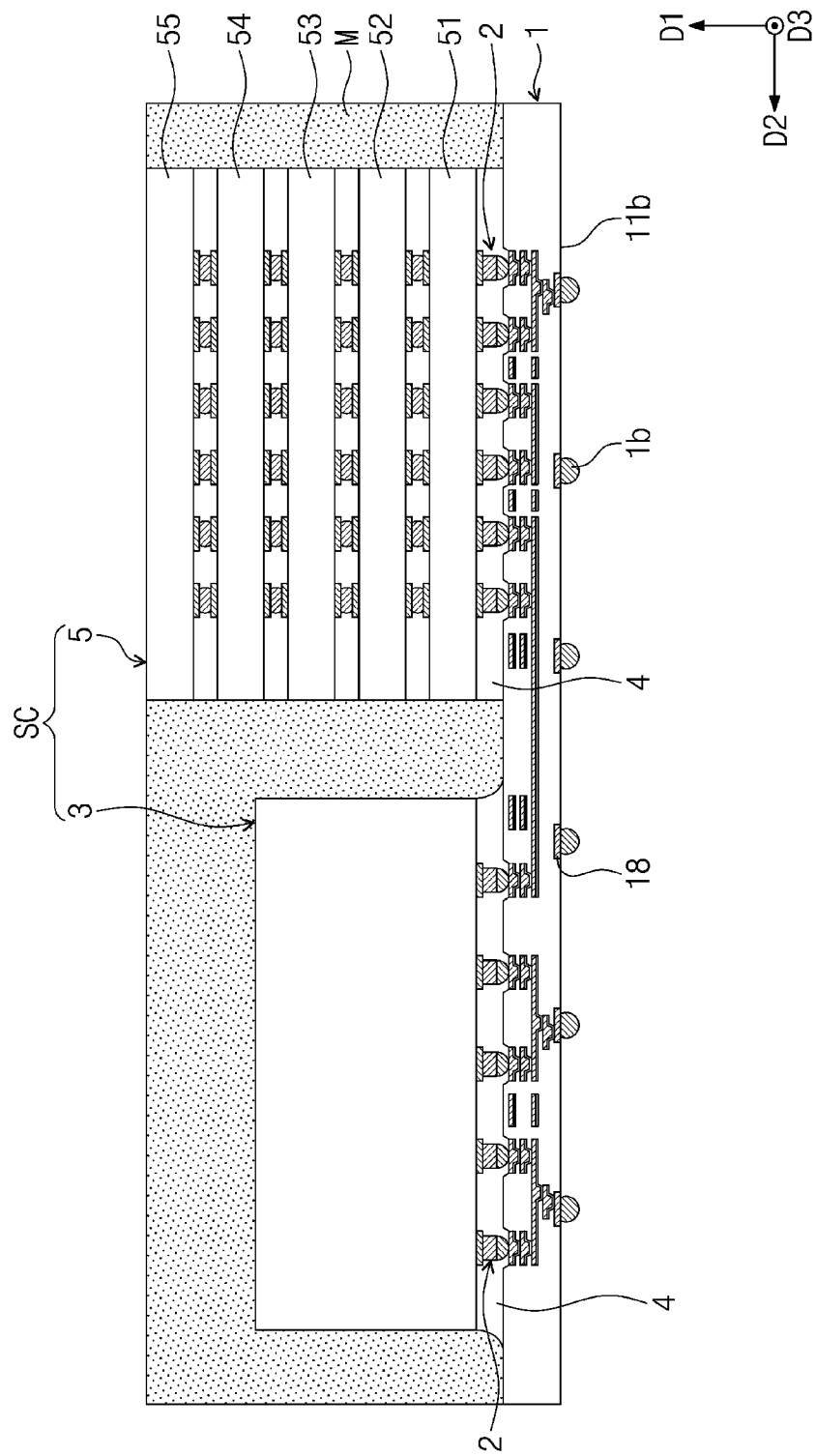

Referring to FIGS. 3 and 20, the cutting of the preliminary redistribution substrate to form the redistribution substrate (step S5) may include cutting the preliminary redistribution substrate 1' (e.g., see FIG. 19) and the mold layer to a desired size of the semiconductor package. The cut piece of the preliminary redistribution substrate may be referred to as the substrate or the redistribution substrate 1. In the second direction D2, a width of the mold layer M may be equal to or similar to a width of the substrate 1.

The coupling of the redistribution substrate to the PCB (step S6) may include coupling the lower substrate 7 (e.g., see FIG. 1) to a bottom of the substrate 1 of the cut shape. The substrate 1 and the lower substrate 7 may be electrically connected to each other by the outer connection ball 1b.

In a semiconductor package and its fabricating method according to an embodiment of the inventive concept, an outer insulating layer may be provided at a level higher than a top surface of a connection pad of a substrate. Thus, when a connection terminal is bonded to the connection pad, it may be possible to prevent a portion of the connection terminal from being deviated to a region out of the connection pad. More specifically, even when the connection terminal is horizontally deformed by heat and pressure, the outer insulating layer may prevent the connection terminal from being excessively deviated. Accordingly, an outwardly-deviated portion of the connection terminal may be prevented from being in contact with a neighboring connection terminal. The semiconductor package according to example embodiments, a short circuit issue may be prevented from being formed between the connection terminals. Thus, it may be possible to reduce a failure ratio of the semiconductor package and to increase the yield of the semiconductor package.

In a semiconductor package and its fabricating method according to example embodiments of the inventive concept, since the short issue between the connection terminals is prevented by the outer insulating layer, it may be possible to reduce a diameter of the connection terminal used in the semiconductor package. For example, it may be possible to prevent the short circuit issue and thereby to increase the yield of the semiconductor package, even when a small connection terminal is used.

In a semiconductor package and its fabricating method according to example embodiments of the inventive concept, since the level of the top surface of the outer insulating layer is higher than the level of the top surface of the connection pad, it may be possible to further reduce a distance between the semiconductor chip and the substrate. For example, the distance between the bottom surface of the semiconductor chip and the top surface of the substrate may be reduced. Accordingly, the warpage issue of the semiconductor package may be improved. Thus, the performance and yield of the semiconductor package may be improved.

In a semiconductor package and its fabricating method according to example embodiments of the inventive concept, since the distance between the bottom surface of the semiconductor chip and the top surface of the substrate is small, it may be easy to fill a region therebetween with an under-fill layer. For example, a space between the semiconductor chip and the substrate may be filled with the under-fill layer using a capillary phenomenon. The smaller the distance between the bottom surface of the semiconductor chip and the top surface of the substrate, the greater the capillary force. Thus, if the distance between the bottom surface of the semiconductor chip and the top surface of the substrate is small, the filling process of the under-fill layer may be more effectively performed. Thus, it may be possible to prevent a void from being formed in the under-fill layer.

In a semiconductor package and its fabricating method according to example embodiments of the inventive concept, a ground electrode may be disposed in a layer, in which a connection pad is formed. Thus, the ground electrode may be disposed in a region that is relatively close to the semiconductor chip. Accordingly, improvement of signal integrity (SI) by the ground electrode may be more effectively achieved.

In a semiconductor package and its fabricating method according to example embodiments of the inventive concept, the ground electrode and the connection pad may be simultaneously formed by performing the same process once. Thus, it may be possible to reduce the total number of process steps and to simplify the overall fabrication. For example, it may be possible to reduce process time and fabrication cost of the semiconductor package.

Figure 21:
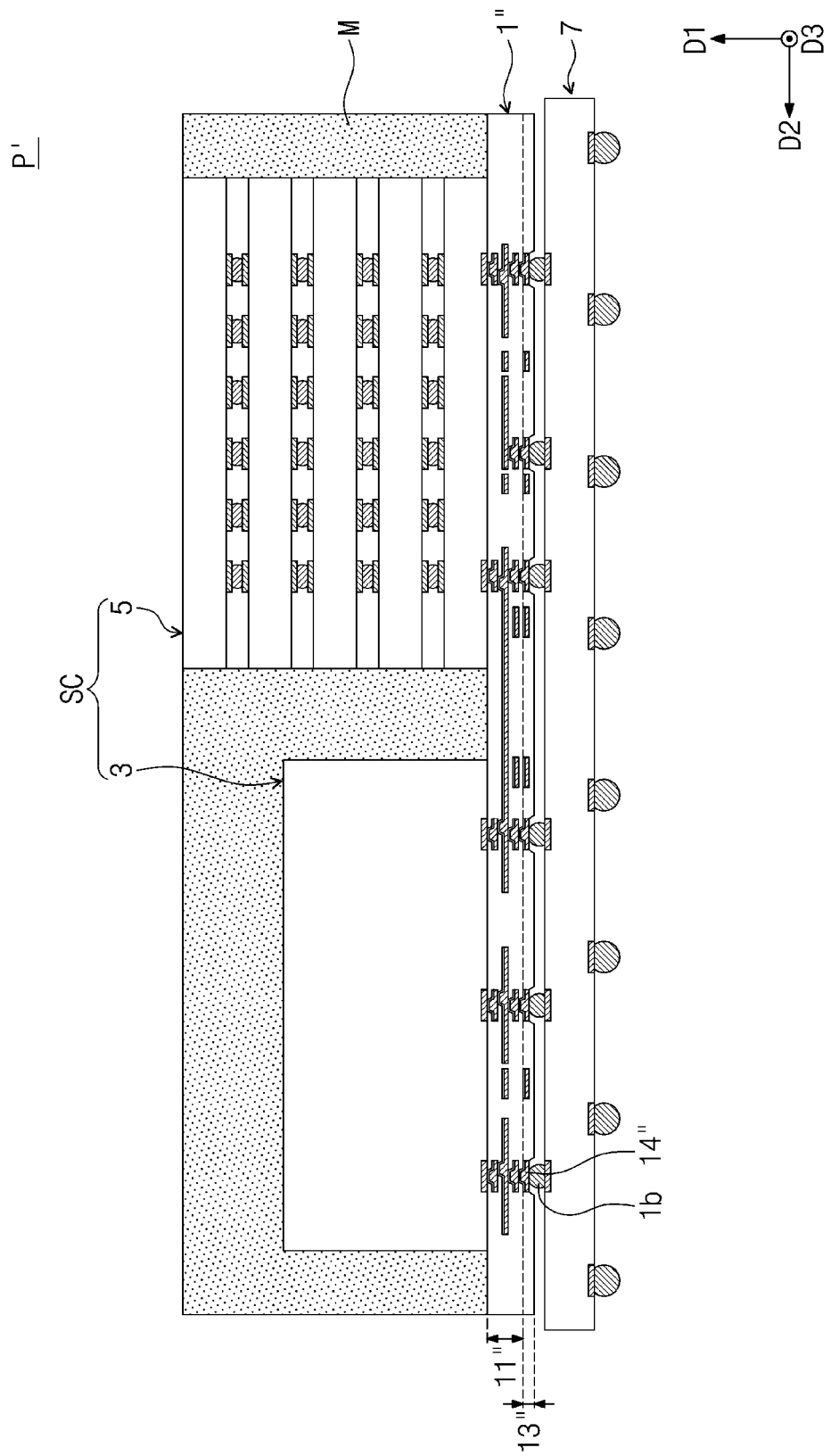
FIG. 21 is a sectional view illustrating a semiconductor package according to an embodiment of the inventive concept.

FIG. 21 is a sectional view illustrating a semiconductor package according to an embodiment of the inventive concept.

In the following description, the features of the semiconductor package, which are overlapped with those described with reference to FIGS. 1 to 20, will be omitted.

Referring to FIG. 21, the semiconductor chip SC may be disposed before the formation of a substrate 1". For example, a semiconductor package P' of FIG. 21 may be fabricated through a chip-first process. The substrate 1" may be formed on a bottom surface of the semiconductor chip SC. More specifically, the substrate 1" may be formed on the bottom surface of the semiconductor chip SC by a method similar to that described with reference to FIGS. 4 to 15. An outer insulating layer 13" may be located at a level lower than an inner insulating layer 11". A connection pad 14" may be coupled to the outer connection ball 1b.

In a semiconductor package and a method of fabricating the same according to example embodiments of the inventive concept, it may be possible to prevent a short circuit issue from being formed between connection terminals.

In a semiconductor package and a method of fabricating the same according to example embodiments of the inventive concept, it may be possible to reduce a pitch of the connection terminals.

In a semiconductor package and a method of fabricating the same according to example embodiments of the inventive concept, it may be possible to improve a signal integrity (SI) property.

In a semiconductor package and a method of fabricating the same according to example embodiments of the inventive concept, it may be possible to easily perform a filling process of an under-fill layer.

In a semiconductor package and a method of fabricating the same according to example embodiments of the inventive concept, it may be possible to prevent or suppress a warpage issue.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor package, comprising:
   a substrate; and
   a semiconductor chip on the substrate,
   wherein the substrate comprises:
   an inner insulating layer;
   a redistribution layer in the inner insulating layer;
   an outer insulating layer on the inner insulating layer;
   a connection pad provided in the outer insulating layer and electrically connected to the redistribution layer; and
   a ground electrode in the outer insulating layer,
   wherein a top surface of the connection pad is exposed by a top surface of the outer insulating layer,
   wherein a level of the top surface of the connection pad is lower than a level of the top surface of the outer insulating layer,
   wherein a level of a bottom surface of the ground electrode is higher than a level of a top surface of the redistribution layer, and
   wherein the outer insulating layer covers a top surface of the ground electrode.

2. The semiconductor package of claim 1, wherein the level of the bottom surface of the ground electrode is a same as a level of a bottom surface of the connection pad.

3. The semiconductor package of claim 1, wherein a thickness of the outer insulating layer ranges from 8 µm to 12 µm.

4. The semiconductor package of claim 1, wherein the outer insulating layer comprises the same material as the inner insulating layer.

5. The semiconductor package of claim 1, wherein the ground electrode comprises the same material as the connection pad.

6. The semiconductor package of claim 5, wherein the ground electrode comprises at least one of copper (Cu), nickel (Ni), and gold (Au).

7. The semiconductor package of claim 1, wherein the substrate further comprises an outer connection ball, which is connect to a bottom surface of the substrate which is opposite to the top surface of the outer insulating layer,
wherein the outer connection ball comprises a ground ball that is grounded, and
wherein the ground electrode is electrically connected to the ground ball.

8. The semiconductor package of claim 1, wherein the semiconductor chip comprises a lower pad, and
wherein the semiconductor package further comprises a connection terminal between the lower pad and the connection pad.

9. The semiconductor package of claim 8, wherein the connection terminal comprises:
a pillar portion coupled to a bottom surface of the lower pad; and
a lower ball between the pillar portion and the connection pad.

10. The semiconductor package of claim 8, wherein a portion of the connection terminal is located at a level lower than the level of the top surface of the outer insulating layer.

11. A semiconductor package, comprising:
a substrate;
a logic chip on the substrate; and
a high bandwidth memory (HBM) provided on the substrate and horizontally spaced apart from the logic chip,
wherein the substrate comprises:
an inner insulating layer;
a redistribution layer in the inner insulating layer;
an outer insulating layer on the inner insulating layer;
a connection pad provided in the outer insulating layer and electrically connected to the redistribution layer; and
a connection via connecting the connection pad to the redistribution layer,
wherein a top surface of the connection pad is exposed by a top surface of the outer insulating layer, and
wherein a level of the top surface of the connection pad is lower than a level of the top surface of the outer insulating layer.

12. The semiconductor package of claim 11, further comprising a lower substrate provided below the substrate.

13. The semiconductor package of claim 11, further comprising an under-fill layer between the logic chip and the substrate.

14. The semiconductor package of claim 11, wherein the logic chip comprises a lower pad,
wherein the semiconductor package further comprises a connection terminal between the lower pad and the connection pad, and
wherein the connection terminal comprises:
a pillar portion coupled to a bottom surface of the lower pad; and
a lower ball between the pillar portion and the connection pad,
wherein at least a portion of the lower ball is located at a level lower than the level of the top surface of the outer insulating layer.

15. The semiconductor package of claim 11, further comprising a ground electrode in the outer insulating layer,
wherein a level of a bottom surface of the ground electrode is higher than a level of a top surface of the redistribution layer, and
wherein the outer insulating layer covers a top surface of the ground electrode.

16. A semiconductor package, comprising:
a redistribution substrate;
a semiconductor chip on the redistribution substrate;
a lower ball electrically connecting the redistribution substrate to the semiconductor chip; and
an under-fill layer between the redistribution substrate and the semiconductor chip,
wherein the redistribution substrate comprises:
an inner insulating layer;
a redistribution layer in the inner insulating layer;
an outer insulating layer on the inner insulating layer;
a connection pad provided in the outer insulating layer and electrically connected to the redistribution layer;
a connection via connecting the connection pad to the redistribution layer; and
a ground electrode in the outer insulating layer,
wherein the connection pad is disposed in an exposure hole, which is provided in the outer insulating layer,
wherein a level of a top surface of the connection pad is lower than a level of a top surface of the outer insulating layer,
wherein the ground electrode is horizontally spaced apart from the connection pad,
wherein a level of a bottom surface of the ground electrode is the same as a level of a bottom surface of the connection pad,
wherein the outer insulating layer covers a top surface of the ground electrode,
wherein the lower ball is electrically connected to the connection pad through an intermediate layer formed between the lower ball and the connection pad, and
wherein a portion of the under-fill layer fills a portion of the exposure hole.

17. The semiconductor package of claim 16, wherein a thickness of the outer insulating layer ranges from 8 µm to 12 µm, and
wherein a thickness of the connection pad is equal to or larger than 4 µm.

18. The semiconductor package of claim 16, wherein the intermediate layer comprises an inter-metallic compound between the connection pad and the lower ball.

19. The semiconductor package of claim 16, wherein a thickness of the ground electrode is the same as a thickness of the connection pad.

20. The semiconductor package of claim 16, wherein the redistribution layer comprises a plurality of redistribution layers, which are vertically overlapped with each other, and
wherein a level of a top surface of the topmost layer of the plurality of redistribution layers is lower than a level of the bottom surface of the ground electrode.

* * * * *